(12) United States Patent
Gaide

(10) Patent No.: US 9,007,110 B1
(45) Date of Patent: Apr. 14, 2015

(54) REGISTER CIRCUITS AND METHODS OF STORING DATA IN A REGISTER CIRCUIT

(71) Applicant: Xilinx, Inc., San Jose, CA (US)

(72) Inventor: Brian C. Gaide, Erie, CO (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 13/936,597

(22) Filed: Jul. 8, 2013

(51) Int. Cl.
*H03K 3/017* (2006.01)

(52) U.S. Cl.
CPC .................................. *H03K 3/017* (2013.01)

(58) Field of Classification Search
None
See application file for complete search history.

(56) References Cited

U.S. PATENT DOCUMENTS

| 5,886,353 | A  | * | 3/1999  | Spivey et al. ............ 250/370.09 |
| 6,380,785 | B2 | * | 4/2002  | Fisher ......................... 327/269 |
| 7,979,827 | B1 |   | 7/2011  | Trimberger et al. |
| 8,044,695 | B2 | * | 10/2011 | Miyazaki .................... 327/203 |
| 8,155,907 | B1 |   | 4/2012  | Lesea et al. |
| 2009/0045861 | A1 | * | 2/2009 | Hayden et al. ............... 327/238 |

* cited by examiner

*Primary Examiner* — Cassandra Cox
(74) *Attorney, Agent, or Firm* — John J. King

(57) ABSTRACT

A register circuit adapted to store data is described. The register circuit comprises a master-slave flip flop coupled to receive the data to be stored by the master-slave flip flop at an input; and a delay element coupled to the master-slave flip flop, the delay element receiving a reference clock signal and generating a slave clock signal the slave clock signal which is delayed relative to a master clock signal. A method of storing data in a register circuit is also described.

20 Claims, 9 Drawing Sheets

US 9,007,110 B1

REGISTER CIRCUITS AND METHODS OF STORING DATA IN A REGISTER CIRCUIT

TECHNICAL FIELD

The present invention relates generally to integrated circuit devices, and in particular, to register circuits and methods of storing data in a register circuit.

BACKGROUND

Data transmission is an important application of many integrated circuit devices. Data may be transmitted according to different transmission protocols, and may be transmitted as serial data or parallel data. Registers are often implemented in circuits to enable the transmission of data. For example, one common arrangement of registers which enables the transmission of data is a shift register, which is a series of registers which continuously advances bits of a data stream using a clock signal coupled to the individual registers of the shift register. Data may also be transmitted within a circuit between registers such as through combinatorial logic or programmable elements which be used to connect the registers.

It is sometimes desirable to increase the delay of data signals to prevent or reduce hold violations. However, it is expensive from the standpoint of available space on an integrated circuit to add delay elements to each data signal. While adding delay to a clock reduces the cost by a factor of the number of registers to which the clock fans out, such an arrangement has the negative effect of creating new hold problems in the preceding stage, thereby defeating the original goal. Adding extra delay to the data path to remove hold time problems is expensive because each data bit must have its own delay element.

SUMMARY

A register circuit adapted to store data is described. The register circuit comprises a master-slave flip flop coupled to receive the data to be stored by the master-slave flip flop at an input; and a control circuit coupled to the master-slave flip flop, the control circuit receiving a reference clock signal and generating the slave clock signal which is delayed relative to a master clock signal.

A register circuit adapted to store data according to another arrangement comprises a master-slave flip flop coupled to receive the data to be stored by the master-slave flip flop at an input, a master clock signal and a slave clock signal; a slave pulse generator coupled to the master-slave flip flop, the slave pulse generator receiving a reference clock signal and generating the slave clock signal which is delayed relative to the master clock signal; and a slave pulse detector coupled to receive the master clock signal and the slave clock signal, the slave pulse detector controlling the generation of the master clock signal.

A method of storing data in a register circuit is also described. The method comprises coupling data to a master-slave flip flop; coupling a reference clock signal to a control circuit; generating a slave clock signal; delaying the slave clock signal relative to a master clock signal; and coupling the master clock signal and the slave clock signal to the master-slave flip flop.

DETAILED DESCRIPTION

Figure 1:
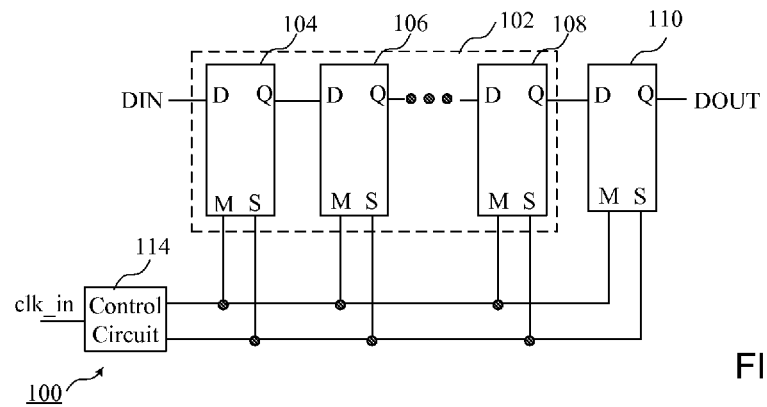
FIG. 1 is a block diagram of a circuit having a plurality of registers implementing a shift register.

Turning first to FIG. 1, a block diagram of a circuit 100 having a plurality of registers implementing a shift register is shown. In particular, a shift register 102 having shift registers 104-108 coupled in series is coupled to an output register 110. A control circuit 114 coupled to receive a reference clock signal (clk_in) generates a pair of clocks signals, designated here as a master clock signal coupled to a master (M) port and a slave clock signal coupled to a slave (S) port of the shift registers 104-108 and the output register 110.

Figure 2:
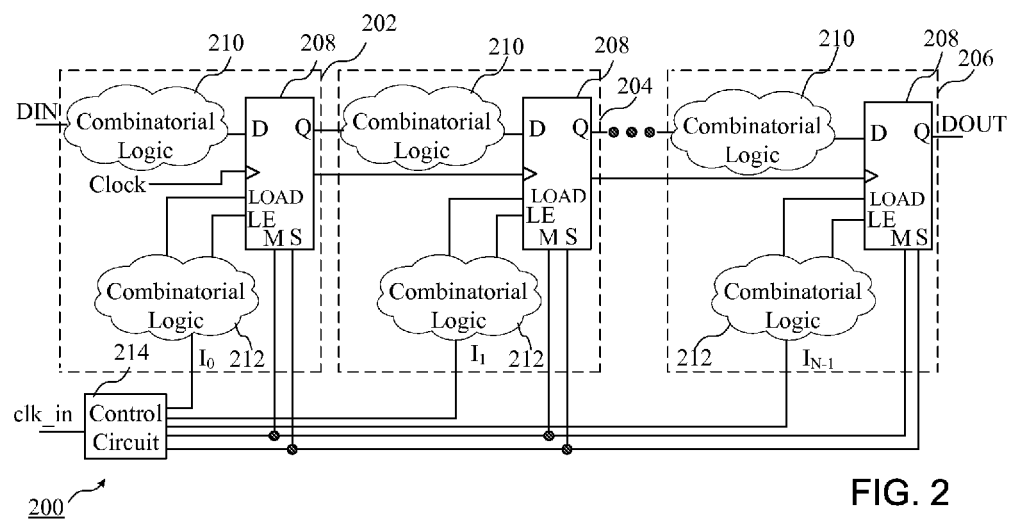
FIG. 2 is a block diagram of a circuit having a plurality of registers coupled to combinatorial logic.

Turning now to FIG. 2, a block diagram of a circuit 200 having a plurality of registers coupled to combinatorial logic is shown. More particularly, a series of circuit blocks 202-206, each comprising a register 208 coupled to one or more combinatorial logic blocks, shown here as combinatorial logic 210 and 212. A control circuit 214 of FIG. 2 also generates separate master and slave clock signals which are coupled to the registers 208. The combinatorial logic 210 may be implemented to generate data signals associated with a data stream (DIN) coupled to a data (D) input of the register, while combinatorial logic 212 may be implemented to couple other data, such as a load value at a load (LOAD) input in response to a load enable signal at a load enable (LE) input based upon control signals $I_0$-$I_{N-1}$ generated by the control circuit 214. While each of the circuit blocks 202-206 comprises combinatorial logic as shown, it should be understood that some of the circuit blocks may not include combinatorial logic 210, combinatorial logic 212, or both. The control circuit 214 is also coupled to receive the reference clock signal clk_in and generate a master clock signal coupled to a master (M) port and a slave clock signal coupled to a slave (S) port of the registers 208.

Figure 3:
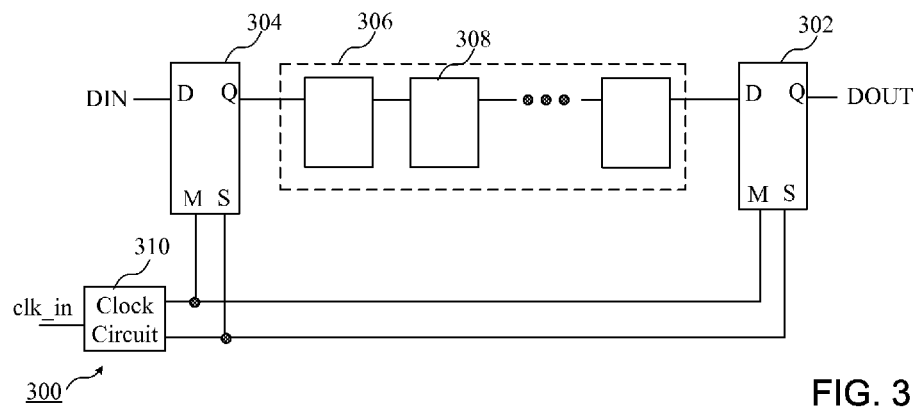
FIG. 3 is a block diagram of a circuit having registers coupled by programmable resources.

Turning now to FIG. 3, a block diagram of a circuit 300 having registers coupled by programmable resources is shown. The circuit 300 comprises a pair of registers 302 and 304 coupled by an interconnect circuit 306 having programmable interconnect resources, shown here as a plurality of programmable interconnect points (PIPs) 308. A control circuit 310 coupled to receive a reference clock signal clk_in generates the master clock signal coupled to a master (M) port and the slave clock signal coupled to a slave (S) port of the registers 302 and 304. While only two registers are shown coupled by the PIPs, it should be understood that many registers may be employed to create a data path for transmitting data. As will be described in more detail below, the pair of master and slave clock signals is generated to prevent and reduce hold violations.

Figure 4:
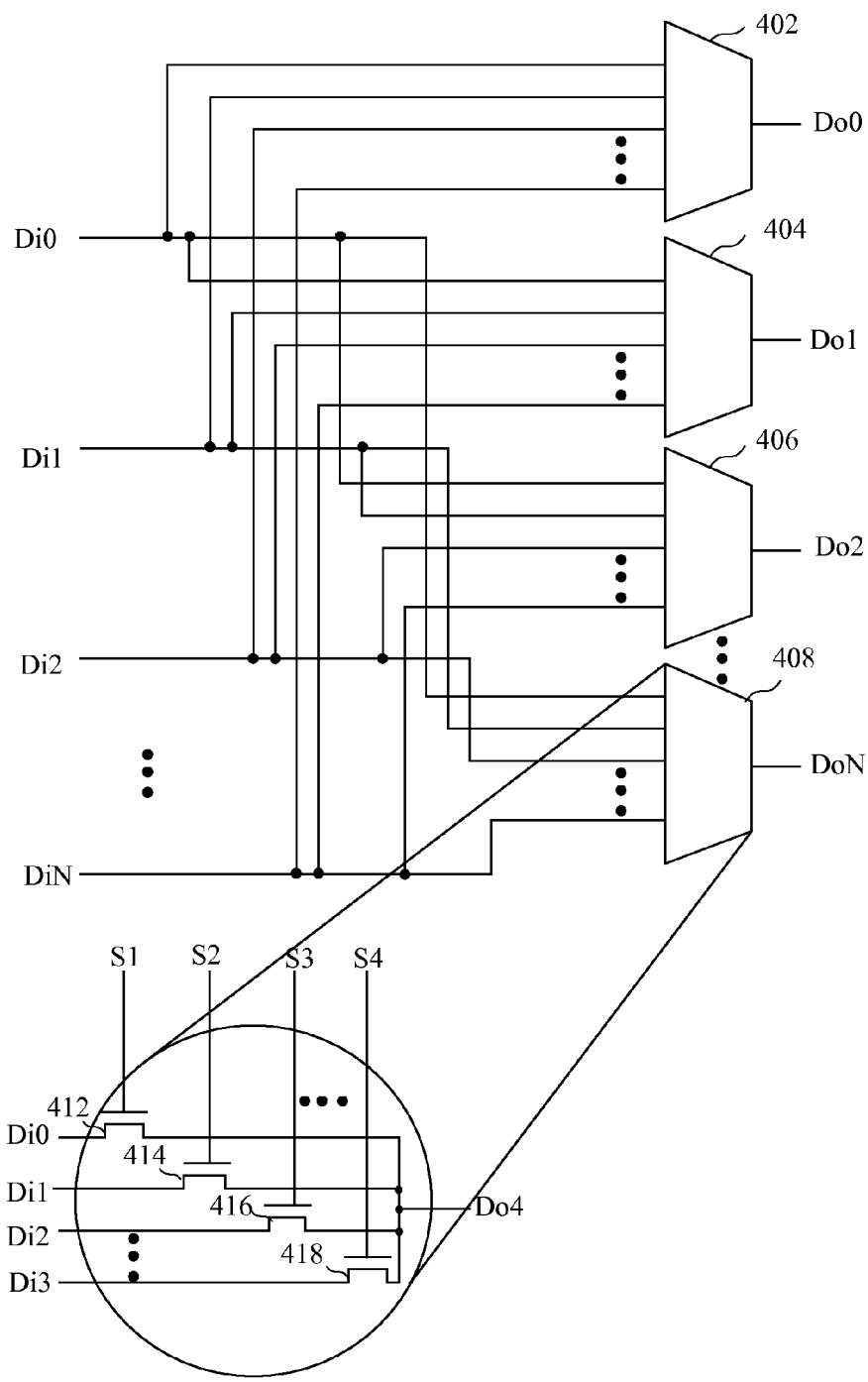
FIG. 4 is a block diagram of a programmable interconnect point which could be implemented in FIG. 3.

Turning now to FIG. 4, a block diagram of a programmable interconnect point which could be implemented in FIG. 3 is shown. The PIP of FIG. 4 comprises a plurality of multiplexers 402-408 which enable the routing of input signals Di0-DiN to various outputs Do0-DoN. An example of a multiplexer is shown as an enlarged portion of multiplexer 408 and comprises transistors 412-418 which are controlled by control signals S1-S4, respectively. As can be seen in FIG. 4, any one of the input signals Di0-DiN can be generated as any of the various outputs Do0-DoN. While FIG. 4 represents one example of an interconnect circuit which may be used to route data between registers, it should be understood that other interconnect circuits could be implemented.

Figure 5:
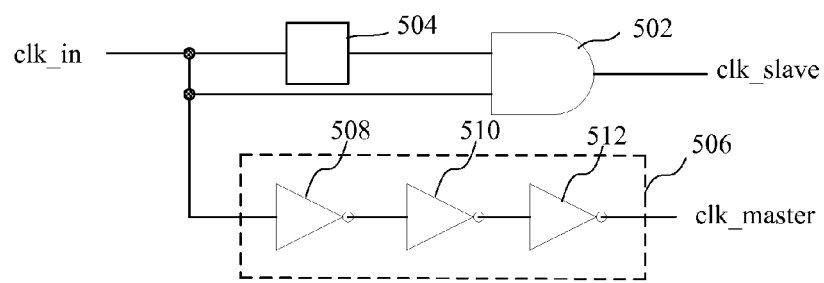
FIG. 5 is a block diagram of a control circuit which could be implemented in FIGS. 1-3.

Turning now to FIG. 5, a block diagram of a control circuit which could be implemented in FIGS. 1-3 is shown. The control circuit of FIG. 5 comprises an AND gate 502 coupled to a delay element 504. The reference clock signal clk_in is coupled to a first input of the AND gate 502 and an input of the delay element 504, an output of which is coupled to a second input of the AND gate 502. The output of the AND gate 502 is the slave clock signal (clk_slave). The reference clock signal clk_in is also coupled to a delay circuit 506 comprising a plurality of delay elements 508-512 to generate the master clock signal (clk_master).

Figure 6:
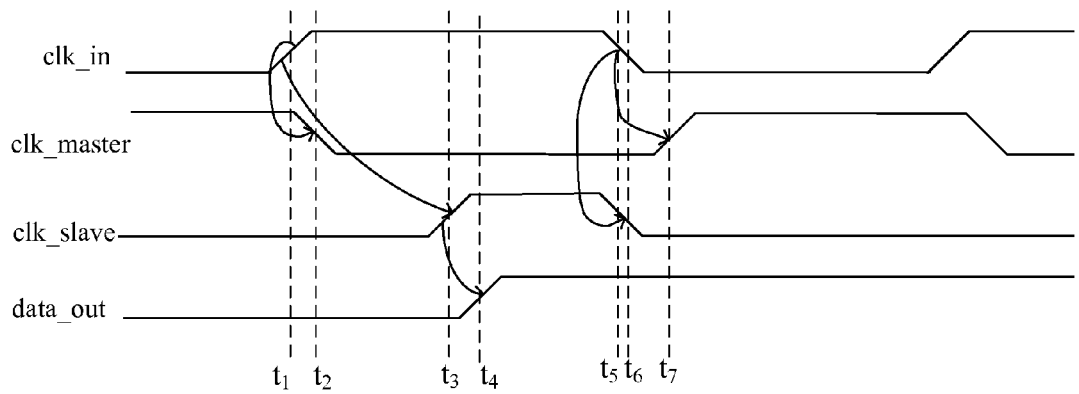
FIG. 6 is a timing diagram showing the operation of a register of FIG. 4.

As shown in the timing diagram of FIG. 6, the rising edge of the clock signal at time $t_1$ causes the master clock signal to go low at a time $t_2$ (at the end of the master clock pulse) after the delay provided by the delay element 506. The rising clock edge of the reference clock signal also causes the slave clock signal to go high at a time $t_3$. That is, when both the reference clock signal and the delayed reference clock signal (generated at the output of the delay element 504) are high, the slave clock signal at the output of the AND gate 502 will go high at time $t_3$ to generate output data at a time $t_4$. The delay element 504 may be a variable delay which enables changing the location of the slave clock pulse relative to the master clock pulse. That is, the delay element 504 will determine the location of the rising edge of the slave clock pulse, and therefore the pulse width of the slave clock pulse, the falling edge of which is determined by the falling edge of the reference clock signal. When the reference clock signal goes low at time $t_5$, the slave clock signal also goes low to end the slave clock signal pulse at a time $t_6$. The falling edge of the reference clock signal also causes the next master clock pulse to be generated at a time $t_7$. As shown in FIG. 6, the master clock signal generated by the circuit of FIG. 5 is an inverted and delayed version of the reference clock signal. As should be apparent from FIGS. 5 and 6, the duration of the active slave clock signal pulse between times $t_3$ and $t_6$ is shorter than one half of a clock cycle of the reference clock signal.

The circuit of FIG. 5 effectively delays the clock to the registers, but does not change timing from the preceding stage. In a conventional device, both master and slave clocks are derived directly from an upstream clock, where the master is an inverted version of clkin and the slave is the non-inverted version. In a master-slave flip flop, the master clock is typically low for the first half cycle and high for the second half cycle, and the slave clock is the opposite. In order to operate correctly, the master and slave latches must each be open long enough for data to propagate through each stage and also be non-overlapping so that data doesn't shoot through both stages on one clock edge. Further, this all must be done within one clock cycle. To maximize the amount of clock cycle time that can be used as a delay, the slave clock is a short pulse, and the master clock triggers right after the slave clock returns to zero. Accordingly, the bulk of the clock cycle can be used to delay the data with the minimum amount of overhead.

According to the circuit of FIG. 5, the timing to the master clock is essentially unaffected, which means setup and hold times to the master register are unchanged. That is, when a clock rising edge is detected, the master clock goes low, capturing the data and preventing the upstream circuit from affecting it, thus preserving setup/hold times. However, the slave clock is delayed relative to the master clock (e.g. between times $t_2$ and $t_3$) to modulate the clock-to-out delay of the register, effectively holding the data in the slave register for a longer amount of time before releasing it downstream. When the slave pulse finally reaches the slave latch, the data is released. After the slave pulse goes low, the master clock goes high again, thus preparing the circuit for the next clock cycle. The maximum amount of possible delay of the slave pulse is $T_{cycle} - (T_d * 2) - T_{nov}$, where $T_d$ is the minimum pulse width required for data to pass through a stage and $T_{nov}$ is the amount of non-overlap required between master and slave clock to prevent shoot through.

Figure 7:
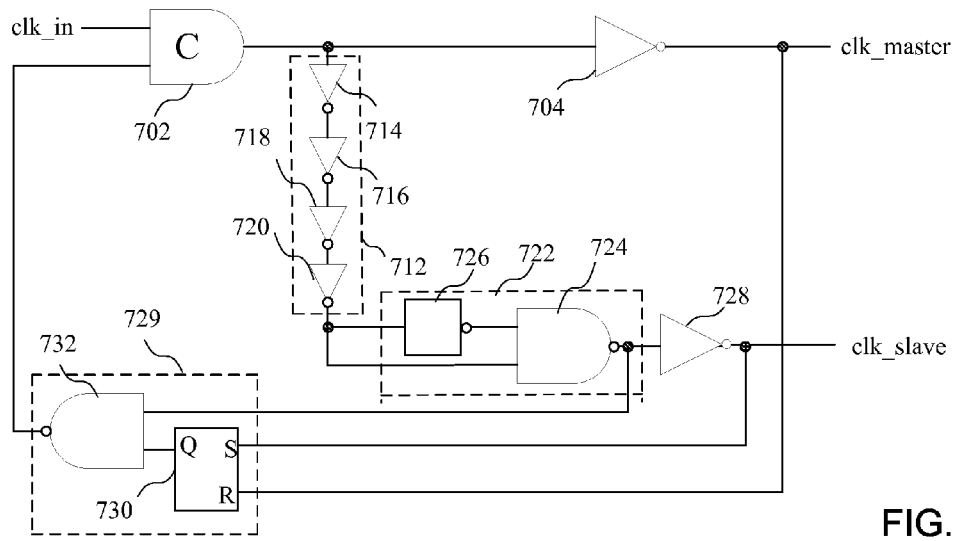
FIG. 7 is a block diagram of another control circuit which could be implemented in FIGS. 1-3.

Turning now to FIG. 7, a block diagram of another control circuit which could be implemented in FIGS. 1-3 is shown. Unlike FIG. 5 which shortens the slave clock pulse which is located within the first half of the clock cycle, the circuit of FIG. 7 enables extending the slave clock pulse to the end of a full clock cycle. In particular, a C element 702 is coupled to receive the reference clock signal, and generate an output which is coupled to a first delay circuit 704. An example of a C element which could be implemented in provided in FIG. 10. The output of the C element 702 is also coupled to a second delay circuit 712 having a plurality of delay elements 714-720. The delay element 712 may be a variable delay element, for example. The output of the delay circuit 712 is coupled to a slave pulse generator 722 having a NAND gate 724 and a delay element 726. The NAND gate 724 receives the output of delay element 726 at a first input and the output of the delay element 712 at a second input, and generates an output pulse which is coupled to an inverter 728.

A slave pulse detector 729 is coupled to receive the output of the slave pulse generator 722, and both the master clock signal and the slave clock signal. The slave pulse detector 729 enables the master clock signal to be generated after the slave clock pulse has occurred (i.e. after the falling edge of the slave clock pulse), and the C element 702 enables the falling edge of the master clock signal after the rising edge of the reference clock signal. That is, when both inputs to the NAND gate 732 are high (on the falling edge of the slave clock signal), the low output of NAND gate 732 and the low reference clock signal will generate a high output of the C element and a low master clock signal.

Figure 8:
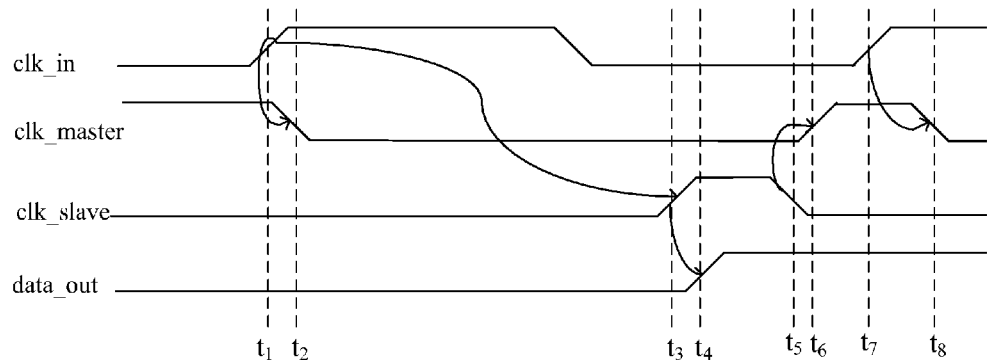
FIG. 8 is a timing diagram showing the operation of FIG. 7.

As shown in the timing diagram of FIG. 8, the slave pulse is delayed into the second half of the clock pulse (i.e. when the reference clock signal is low). In particular, after the reference clock signal goes high at time $t_1$ causing the master clock signal to go low at a time $t_2$, the slave clock signal does not go high at the rising edge of the slave clock pulse until the second half of the clock pulse at time $t_3$, where the data is then available at a time $t_4$. The delay of the slave clock signal between times $t_2$ and $t_3$ is based upon the delay elements 712 and 726. The falling edge of the slave clock pulse occurs at a time $t_5$ before the rising edge of the master clock pulse at a time $t_6$. The falling edge of the slave clock pulse is determined by the delay element 726 of the slave pulse generator 722. The rising edge of the reference clock signal at a time $t_7$ causes the master clock signal to go low again at a time $t_8$ to restart the cycle.

Figure 9:
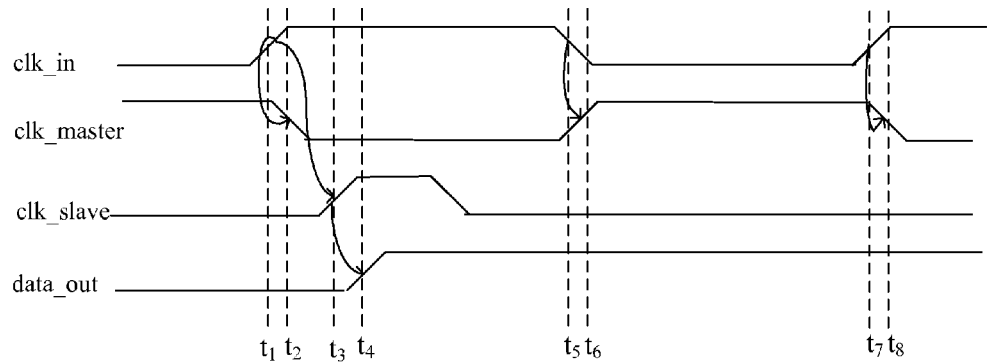
FIG. 9 is another timing diagram showing the operation of FIG. 7.

As shown in the timing diagram of FIG. 9, the slave pulse detector 729 of FIG. 7 enables a wider range of slave pulse signals. The later of the falling edge of the slave clock signal or the reference clock signal will dictate when the master clock rises. Unlike in the timing of FIG. 8 where the master clock rises based upon the falling edge of the slave clock signal, the master clock rises at a time $t_6$ on the falling edge of the reference clock signal at a time $t_5$ according to the timing of FIG. 9. That is, the slave clock can be generated at different locations within the clock cycle based upon the variable delay element 712. One benefit of the circuit of FIG. 9 is that it enables maximizing the range of delay values to delay the data path. Accordingly, it is necessary to shorten the time the master clock is high by delaying the rising edge of the master clock where the slave clock is delayed until the second half of the clock cycle. That is, without delaying the master clock, any delay would be limited to half a clock cycle (because the master clock is high for the second half of the clock cycle and both slave and master clocks cannot be simultaneously high). Delaying the master clock rising edge is a functional requirement so that the slave pulse does not open the slave latch at the same time the master clock opens the master latch, which could cause data shoot-through (i.e. data which goes straight through the latch without stopping).

Because the slave pulse occurs in the first half cycle in FIG. 9, there is no need to shorten the master clock. The master clock goes low to high when both the slave clock transitions low AND reference clock is low. In FIG. 8, because the reference clock is already low, the falling edge of slave clock triggers the master clock to go high. In FIG. 9, slave clock goes low while the reference clock is still high, so the circuit waits until the reference clock goes low and then transitions the master clock high. Accordingly, the circuits of FIGS. 5 and 7 effectively delay the slave clock signal of the clock network, thereby reducing cost relative to data delays, but do not affect the timing to the flop's preceding stages, avoiding creating hold violations in preceding stages.

Figure 10:
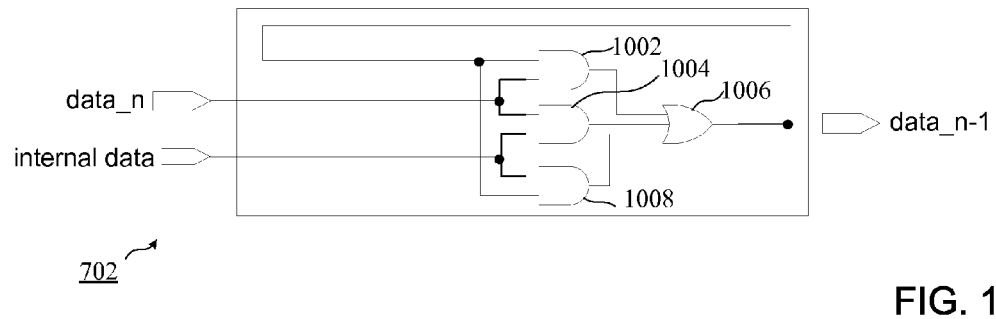
FIG. 10 is a block diagram of the "C" element of FIG. 7.

Turning now to FIG. 10, a block diagram of the C element of FIG. 7 is shown. In particular, the C element comprises AND gates 1002 and 1004 coupled to receive an input data signal (data_n) at first inputs. Outputs of the AND gates 1002 and 1004 are coupled to an OR gate 1006, the output of which is the previous data value (data_n−1) and is also coupled to a second input of the AND gate 1002 and an AND gate 1008. The output of the AND gate 1008 is also coupled to the OR gate 1006. The AND gates 1004 and 1008 are coupled to receive an internal data signal, which could be the output of the NAND gate 732 for example. The C element of FIG. 10 will generate an output which matches the states of both inputs if they are in the same state, or retain the previous state if another input is changed.

Figure 11:
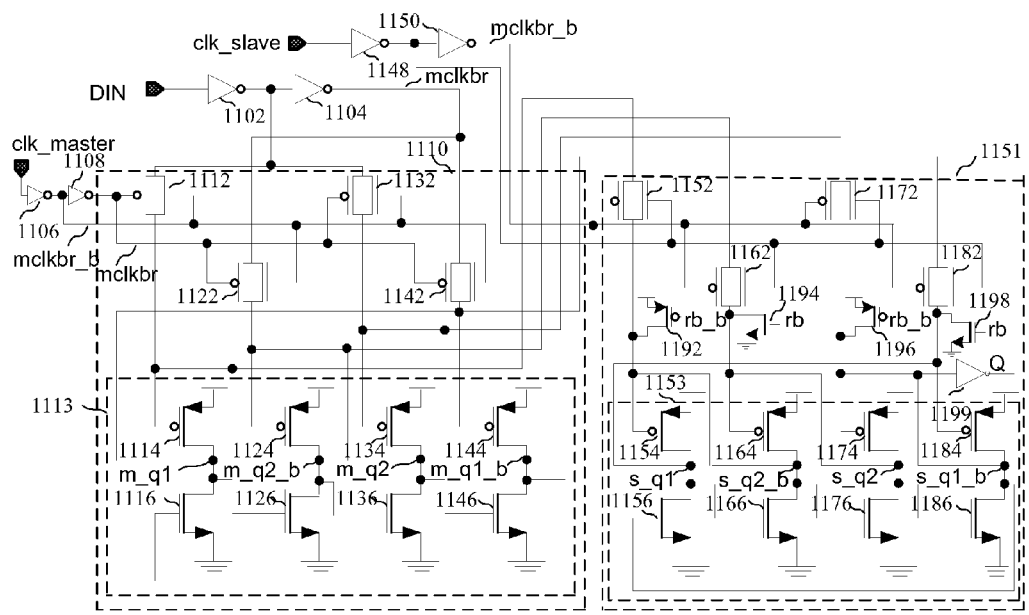
FIG. 11 is a block diagram of a master-slave flip flop.

Turning now to FIG. 11, a block diagram of a master-slave flip flop is shown. In particular, input data (DIN) is provided to a first inverter 1102, the output of which is input to the master stage of the master-slave flip flop and is input to a second inverter 1104. The master clock signal is coupled to an inverter 1106 which generates an inverted clock signal mclkbr_b which is coupled to a second inverter 1108, which generates them clkbr signal. The output of the inverter 1102 and the inverted output generated by the inverter 1104 are coupled to a master flip-flop 1110 to control various paths of the master flip-flop. In particular, the output of the inverter gate 1102 is coupled to a pass gate 1112, comprising a pair of transistors which are controlled by a clock and inverted clock signal, mclkbr and mclkbr_b, respectively. The output of the pass gate 1112 is coupled to an inverter circuit 1113 having a plurality of inverters comprising complementary p-channel and n-channel transistors. In particular, the output of the pass gate 1112 is coupled to a gate of an associated p-channel transistor 1114 having a source pulled high and a drain coupled to a drain of an n-channel transistor 1116 which has a source coupled to ground. The node at the connection of the drain of transistor 1114 and the drain of transistor 1116 comprises an inverter node. The gate of transistor 1116 is controlled by an inverter node of another path of the master section, as will be described in more detail below. The output of the inverter 1104 is coupled to a pass gate 1122 of a second stage. The pass gate 1122 also comprises a pair of transistors and has an output coupled to an associated inverter comprising a transistor 1124 and a transistor 1126. The output of the pass gate 1122 is coupled to the gate of the transistor 1124 which has a source pulled high and a drain coupled to the drain of the transistor 1126. The gate of transistor 1126 is coupled to receive the signal at the inverter node of a separate inverter (i.e. the node between transistors 1114 and 1116).

Two additional stages also receive the output of the inverter 1102 and inverter 1104. In addition to generating m_q1 and m_q1_b signals at primary nodes as in a conventional circuit (both of which are based upon the output of inverter 1104), redundant data is used to generate m_q2 and m_q2_b signals at redundant nodes (both of which are based upon the output of the inverter 1102), as will be described in more detail below. In particular, the output of the NAND gate 1102 is coupled to a pass gate 1132 comprising a pair of transistors. The output of the pass gate 1132 is coupled to a gate of an associated transistor 1134 having a source pulled high and a drain coupled to a drain of a transistor 1136 which has a source coupled to ground. The gate of the transistor 1136 is coupled to receive the signal at the inverter node of a separate inverter (i.e. the node between transistors 1124 and 1126). Finally, the output of the inverter 1104 is coupled to a pass gate 1142 of a second stage. The pass gate 1142 also comprises a pair of transistors and has an output coupled to an inverter comprising a transistor 1144 and a transistor 1146. The output of the pass gate 1142 is coupled to the gate of the transistor 1144 which has a source pulled high and a drain coupled to the drain of the transistor 1146. The gate of transistor 1146 is coupled to receive the signal at the inverter node between transistors 1134 and 1136. The inverter node at the drains of the transistors 1144 and 1146 is also coupled to control the gate of transistor 1116.

The inverters of the four stages in the master flip-flop, whose gates and drains are selectively connected to the true and complement data lines through the pass gates, enable resetting the data of the various nodes in the event of an error. While the affected input data line or the internal nodes in the master and slave circuits of the flip-flop will flip to the opposite state and cause incorrect data which will be transferred to the next stage in the following logic in a conventional circuit, each inverter of the circuit of FIG. 11 is controlled by an associated node, and an inverter node of each inverter is coupled to a separate node to reset the separate node. The drain of transistors 1114 and 1116 are coupled to the output of the pass gate 1142, the drains of transistors 1124 and 1126 are coupled to the output of the pass gate 1112, the drains of the transistors 1134 and 1136 are coupled to the output of the pass gate 1122, and the drains of the transistors 1144 and 1146 are coupled to the output of the pass gate 1132. If data on m_q2 at the output of pass gate 1122 is corrupted, for example, the inverter node between transistors 1134 and 1136 of a separate inverter will reset the node to the correct value. That is, while the data at the output of pass gate 1122 is based upon data at the output of inverter 1104, the data at the output of pass gate 1132 is based upon data output by inverter 1102, and therefore will correct the data corrupted if the output of inverter 1104 or the pass gate 1122 is corrupted. By way of example, if the output of the pass gate 1122 should be high (but is changed to a low state due to an error) and the output of the pass gate 1132 is low as expected, the low signal at the gate of transistor 1134 will pull the node m_q2 high, resetting the node to a high value. Accordingly, a primary node (e.g. m_q2) is reset by a redundant node (e.g. m_q1_b coupled to the gate of the transistor 1134). Any particle striking on any node of the flip-flop at one of the data lines of the master circuit will cause only a temporary upset on that node. The redundant path will reset the affected path and recover the correct data. The self-correcting feature of the inverter circuit 1113 enables a master-slave flip-flop to operate in a high radiation environment, such as space. The master flip-flop will work either in the stand-by mode when the clock is idle or in dynamic operation when the clock is running.

The slave flip-flop 1151 of the master-slave pair also enables self-correction. The inverters in the slave section also comprise transistors which are selectively connected to the true and complement internal nodes from the master section through pass gates. The data at the outputs of the pass gates 1112, 1122, 1132, and 1142 are coupled to the pass gates of the circuit 1151. In particular, the output of the pass gate 1112 is coupled to a pass gate 1152, comprising a pair of transistors which are controlled by a clock and inverted clock signal, sclkbr and sclkbr_b respectively, generated based upon the slave clock signal by way of inverters 1148 and 1150 (where the master and slave clock signals are generated as set forth above). The output of the pass gate 1152 is coupled to an inverter circuit 1153, and in particular a gate of a transistor 1154 having a source pulled high and a drain coupled to a drain of a transistor 1156 which has a source coupled to ground. The node at the connection of the source of transistor 1154 and the drain of transistor 1156 comprises an inverter node. The gate of transistor 1156 is controlled by an inverter node of another path of the slave flip-flop, as will be described below. The output of the pass gate 1122 is coupled to a pass gate 1162 of the slave flip-flop. The pass gate 1162 also comprises a pair of transistors and has an output coupled to an inverter comprising a transistor 1164 and a transistor 1166. The output of the pass gate 1162 is coupled to the gate of the transistor 1164 which has a source pulled high and a drain coupled to the drain of the transistor 1166. The gate of transistor 1166 is coupled to receive the signal at the inverter node between transistors 1154 and 1156.

Two additional stages also receive the output of pass gates of the master flip-flop. In particular, the output of the pass gate 1132 is coupled to a pass gate 1172, comprising a pair of transistors which are controlled by a clock and inverted clock signal, sclkbr and sclkbr_b respectively. The output of the pass gate 1172 is coupled to a gate of a transistor 1174 having a source pulled high and a drain coupled to a drain of a transistor 1176 which has a source coupled to ground. The node at the connection of the source of transistor 1174 and the drain of transistor 1176 comprises an inverter node. The gate of transistor 1176 is controlled by an inverter node of the inverter created by transistors 1164 and 1166. Finally, the output of pass gate 1142 is coupled to a pass gate 1182 of the slave flip-flop. The pass gate 1182 also comprises a pair of transistors and has an output coupled to an inverter comprising a transistor 1184 and a transistor 1186. The output of the pass gate 1182 is coupled to the gate of the transistor 1184 which has a source pulled high and a drain coupled to the drain of the transistor 1186. The gate of transistor 1186 is coupled to receive the signal at the inverter node between transistors 1174 and 1176.

The nodes of the inverters are also coupled to a separate node of the slave flip-flop, as described above with respect to the master flip-flop. In particular, the node at the drains of transistors 1154 and 1156 are coupled to the output of pass gate 1182, the node at the drains of transistors 1164 and 1166 are coupled to the output of pass gate 1152, the node at the drains of transistors 1174 and 1176 are coupled to the output of pass gate 1162, and the node at the drains of transistors 1184 and 1186 are coupled to the output of pass gate 1172.

Figure 12:
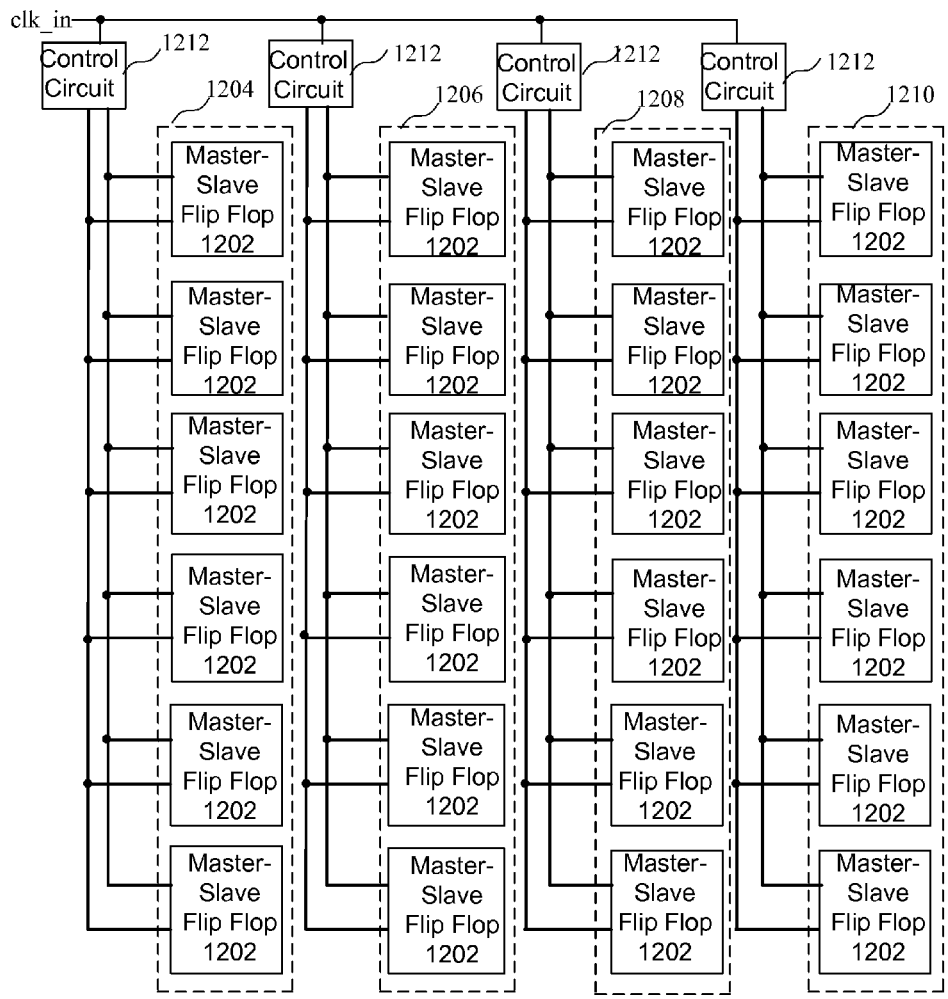
FIG. 12 is a block diagram of an arrangement of registers controlled by a plurality of control circuits.

Turning now to FIG. 12, a block diagram of an arrangement of registers controlled by a plurality of clock circuits is shown. As shown in FIG. 12, a plurality of blocks 1204-1210 of master-slave flip flops 1202 are provided, where the master-slave flip flops of each block are controlled by a separate control circuit 1212. That is, rather than providing delay elements which enable the generation of the master and slave clocks as set forth above in reference to FIGS. 5-9, a control circuit 1212 is provided to provide the master and slave clock signals to a plurality of master-slave flip flops. While 6 master-slave flip flops as shown here are controlled by a common control circuit 1212, any number of master-slave flip flops could be controlled by a single clock circuit. By providing multiple clock circuits 1212, the circuit of FIG. 12 can be optimized in terms of delay resource requirements and timing of the clock signals reaching the master-slave flip flops.

Figure 13:
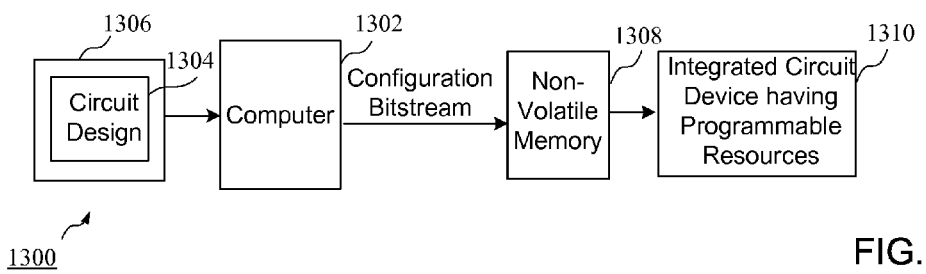
FIG. 13 is a block diagram of a system for programming a device having programmable resources.

Turning now to FIG. 13, a block diagram of a system for programming a device having programmable resources according to an embodiment is shown. In particular, a computer 1302 is coupled to receive a circuit design 1304 from a memory 1306, and generates a configuration bitstream which is stored in the non-volatile memory 1306. As will be described in more detail below, the circuit design may be a high level design, such as a circuit design defined in a hardware description language (HDL). Also, the computer may be configured to run software that generates a configuration bitstream which is stored in the non-volatile memory 1308 and provided to an integrated circuit 1310 which may be a programmable integrated circuit, such as the integrated circuit described below in FIG. 13. As will be described in more detail below, bit of the configuration bitstream are used to configure programmable resources of the integrated circuit.

Figure 14:
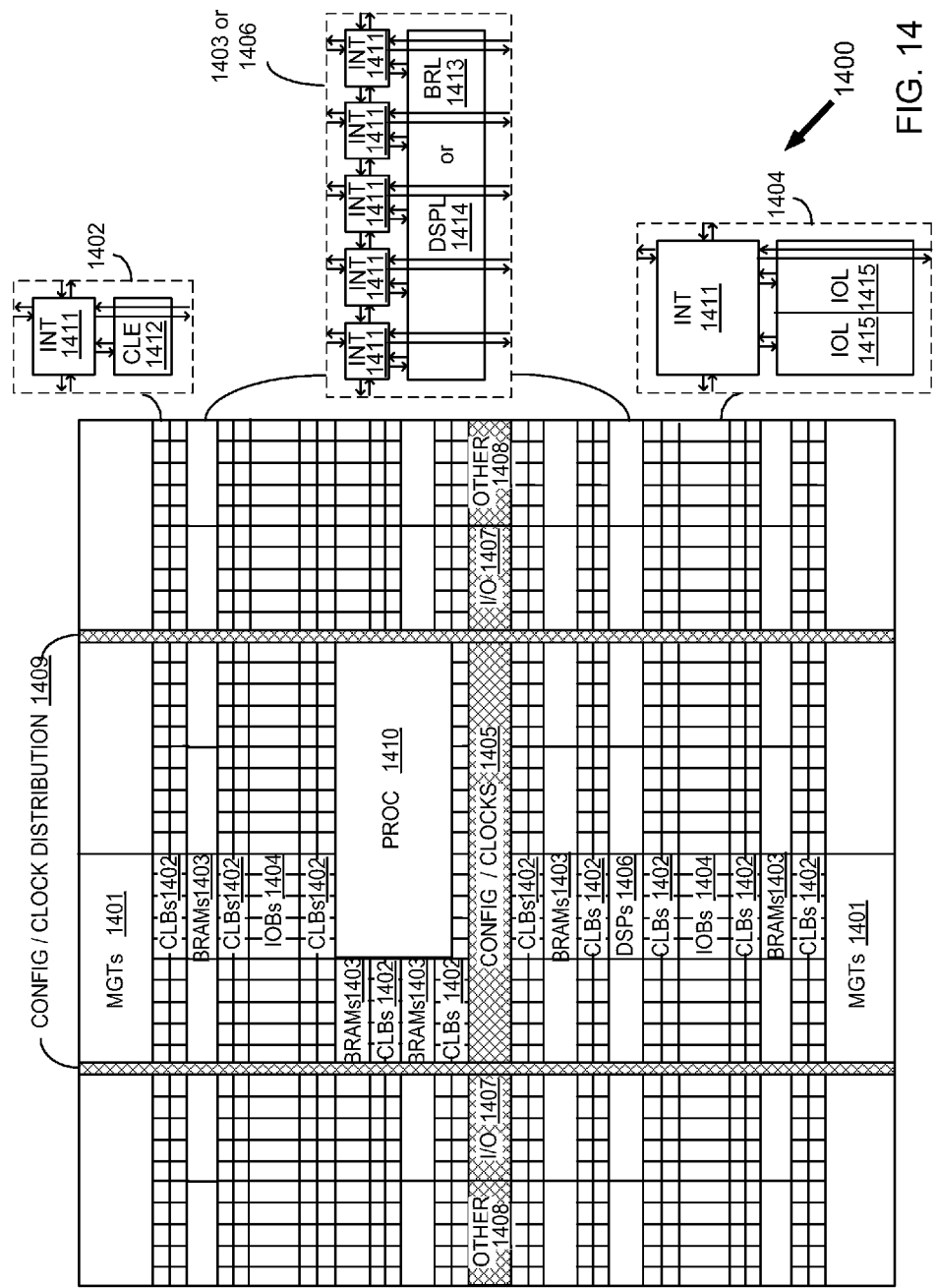
FIG. 14 is a block diagram of a device having programmable resources which may implement the circuits of FIGS. 1-12.

Turning now to FIG. 14, a block diagram of a device having programmable resources including the circuits of FIGS. 1-12 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 14 comprises an FPGA architecture 1400 having a large number of different programmable tiles including multi-gigabit transceivers (MGTs) 1401, CLBs 1402, random access memory blocks (BRAMs) 1403, input/output blocks (IOBs) 1404, configuration and clocking logic (CONFIG/CLOCKS) 1405, digital signal processing blocks (DSPs) 1406, specialized input/output blocks (I/O) 1407 (e.g., configuration ports and clock ports), and other programmable logic 1408 such as digital clock managers, analog-to-digital converters, system monitoring logic, and so forth. Some FPGAs also include dedicated processor blocks (PROC) 1410, which may be used to implement a software application, for example.

In some FPGAs, each programmable tile includes a programmable interconnect element (INT) 1411 having standardized connections to and from a corresponding interconnect element in each adjacent tile. Therefore, the programmable interconnect elements taken together implement the programmable interconnect structure for the illustrated FPGA. The programmable interconnect element 1411 also includes the connections to and from the programmable logic element within the same tile, as shown by the examples included at the top of FIG. 14.

For example, a CLB 1402 may include a configurable logic element (CLE) 1412 that may be programmed to implement user logic plus a single programmable interconnect element 1411. A BRAM 1403 may include a BRAM logic element (BRL) 1413 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1406 may include a DSP logic element (DSPL) 1414 in addition to an appropriate number of programmable interconnect elements. An IOB 1404 may include, for example, two instances of an input/output logic element (IOL) 1415 in addition to one instance of the programmable interconnect element 1411. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 14 include additional logic blocks that disrupt the regular columnar structure making up a large part of the FPGA. The additional logic blocks may be programmable blocks and/or dedicated logic. For example, the processor block PROC 1410 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear in order to facilitate the efficient implementation of user logic. While the embodiment of FIG. 14 relates to an integrated circuit having programmable resources, it should be understood that the circuits and methods set forth in more detail below could be implemented in any type of ASIC.

Figure 15:
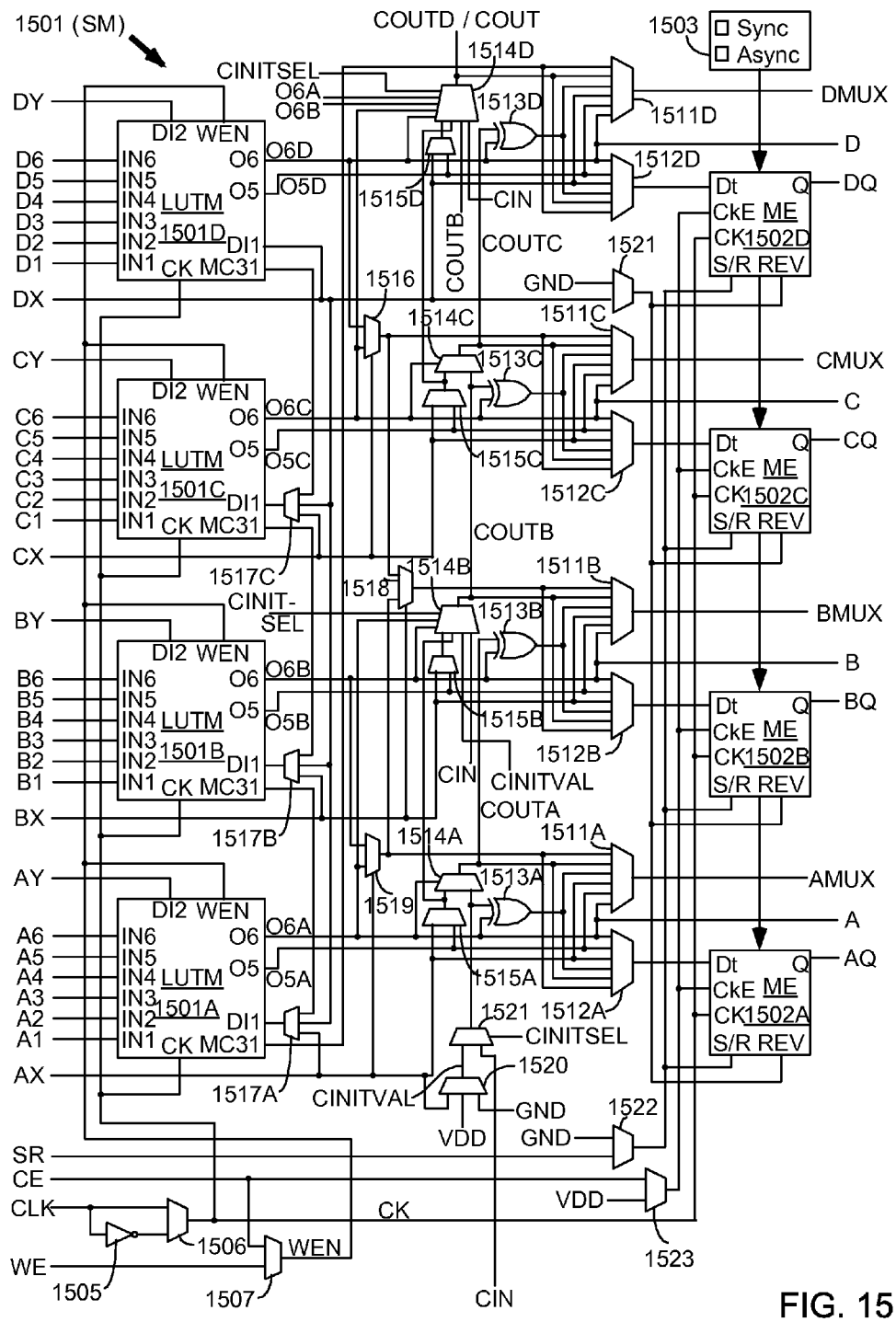
FIG. 15 is a block diagram of a configurable logic element of the device of FIG. 14.

Turning now to FIG. 15, block diagram of a configurable logic element of the device of FIG. 14 is shown. In particular, FIG. 15 illustrates in simplified form a configurable logic element of a configuration logic block 1402 of FIG. 14. In the embodiment of FIG. 15, slice M 1501 includes four lookup tables (LUTMs) 1501A-1501D, each driven by six LUT data input terminals A1-A6, B1-B6, C1-C6, and D1-D6 and each providing two LUT output signals O5 and O6. The O6 output terminals from LUTs 1501A-1501D drive slice output terminals A-D, respectively. The LUT data input signals are supplied by the FPGA interconnect structure via input multiplexers, which may be implemented by programmable interconnect element 1511, and the LUT output signals are also supplied to the interconnect structure. Slice M also includes: output select multiplexers 1511A-1511D driving output terminals AMUX-DMUX; multiplexers 1512A-1512D driving the data input terminals of memory elements 1502A-1502D; combinational multiplexers 1516, 1518, and 1519; bounce multiplexer circuits 1522-1523; a circuit represented by inverter 1505 and multiplexer 1506 (which together provide an optional inversion on the input clock path); and carry logic having multiplexers 1514A-1514D, 1515A-1515D, 1520-1521 and exclusive OR gates 1513A-1513D. All of these elements are coupled together as shown in FIG. 15. Where select inputs are not shown for the multiplexers illustrated in FIG. 15, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 15 for clarity, as well as from other selected figures herein.

In the pictured embodiment, each memory element 1502A-1502D may be programmed to function as a synchronous or asynchronous flip-flop or latch. The selection between synchronous and asynchronous functionality is made for all four memory elements in a slice by programming Sync/Asynch selection circuit 1503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1502A-1402D are clocked by a clock signal CK, which may be provided by a global clock network or by the interconnect structure, for example. Such programmable memory elements are well known in the art of FPGA design. Each memory element 1502A-1502D provides a registered output signal AQ-DQ to the interconnect structure. Because each LUT 1501A-1501D provides two output signals, O5 and O6, the LUT may be configured to function as two 5-input LUTs with five shared input signals (IN1-IN5), or as one 6-input LUT having input signals IN1-IN6.

In the embodiment of FIG. 15, each LUTM 1501A-1501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1517A-1517C for LUTs 1501A-1501C), or to the two 32-bit RAMs via input terminals DI1 and DI2. RAM write operations in the LUT RAMs are controlled by clock signal CK from multiplexer 1506 and by write enable signal WEN from multiplexer 1507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1501A may also be provided to the general interconnect structure for shift register chaining, via output select multiplexer 1511D and CLE output terminal DMUX. Accordingly, the circuits and methods set forth above may be implemented in a device such as the devices of FIGS. 14 and 15, or any other suitable device.

Figure 16:
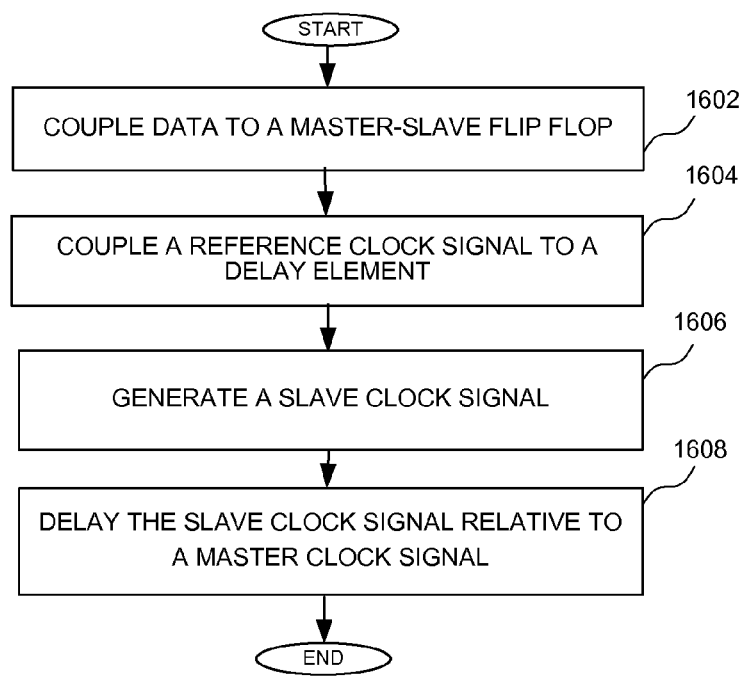
FIG. 16 is a flow chart showing a method of storing data in a register circuit.

Turning now to FIG. 16, a flow chart shows a method of storing data in a register circuit. In particular, data is coupled to a master-slave flip flop at a step 1602. A reference clock signal is coupled to a delay element at a step 1604. A slave clock signal is generated at a step 1606. The slave clock signal is delayed relative to a master clock signal at a step 1608.

The various elements of the method of FIG. 16 may be implemented using the circuits of FIGS. 1-15 as described, or using some other suitable circuits. While specific elements of the method are described, it should be understood that additional elements of the method, or additional details related to the elements, could be implemented according to the disclosure of FIGS. 1-15.

It can therefore be appreciated that a new register circuit and method of storing data in a register circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A register circuit adapted to store data, the register circuit comprising:
a master-slave flip flop coupled to receive the data to be stored by the master-slave flip flop at an input; and
a control circuit coupled to the master-slave flip flop, the control circuit receiving a reference clock signal and generating the slave clock signal which is delayed relative to a master clock signal;
wherein the control circuit comprises a first delay element establishing a pulse width of the slave clock signal, and a second delay element establishing a delay of the slave clock signal relative to the master clock signal.

2. The register circuit of claim 1, wherein the slave clock signal is delayed relative to the master clock signal by reducing the width of the pulse of the slave clock signal.

3. The register circuit of claim 1, wherein the first delay element is coupled to receive the reference clock signal and generate the slave clock signal.

4. The register circuit of claim 3, wherein the second delay element is coupled to receive the reference clock signal and generate the master clock signal.

5. The register circuit of claim 1, further comprising a slave pulse generator coupled to receive a delayed reference clock signal, wherein the slave clock signal generated by the slave pulse generator comprises a pulse.

6. The register circuit of claim 5, wherein the pulse generated by slave pulse generator is in a first half of a clock cycle of the reference clock signal.

7. The register circuit of claim 1, further comprising a slave pulse detector coupled to receive the master clock signal and the slave clock signal, the slave pulse detector controlling the generation of a pulse of the master clock signal.

8. A register circuit adapted to store data, the register circuit comprising:
a master-slave flip flop coupled to receive the data to be stored by the master-slave flip flop at an input, a master clock signal and a slave clock signal;
a slave pulse generator coupled to the master-slave flip flop, the slave pulse generator receiving a reference clock signal and generating the slave clock signal which is delayed relative to the master clock signal; and
a slave pulse detector coupled to receive the master clock signal and the slave clock signal, the slave pulse detector controlling the generation of the master clock signal.

9. The register circuit of claim 8, wherein the slave pulse generator comprises a first delay element which reduces the pulse width of the slave clock circuit.

10. The register circuit of claim 9, wherein the slave pulse detector comprises a second delay element adapted to delay an edge of the master clock signal relative to the slave clock signal.

11. The register circuit of claim 8, wherein the slave pulse detector comprises a set-reset flip flop coupled to receive the master clock signal at a set input and the slave clock signal at a reset input.

12. The register circuit of claim 11, wherein the slave pulse detector further comprises a NAND gate coupled to an output of the set-reset flip flop and an output of the slave pulse generator.

13. The register circuit of claim 8, wherein a slave clock pulse is generated after a delay which is greater than one half of a clock cycle.

14. The register circuit of claim 8, further comprising a rising clock edge detector coupled to receive the reference clock signal and an output of the slave pulse detector.

15. A method of storing data in a register circuit, the method comprising:
coupling data to a master-slave flip flop;
coupling a reference clock signal to a control circuit;
generating a slave clock signal using a first delay element to establish a pulse width of the slave clock signal;
establishing a delay of the slave clock signal relative to a master clock signal using a second delay element; and
coupling the master clock signal and the slave clock signal to the master-slave flip flop.

16. The method of claim 15, wherein delaying the slave clock signal relative to the master clock signal comprises shortening the pulse width of the slave clock signal.

17. The method of claim 15, wherein generating a slave clock signal comprises generating the slave clock signal within one half of the clock cycle of the reference clock signal.

18. The method of claim 15, further comprising receiving the reference clock signal at a delay element and generating the master clock signal at the output of the delay element.

19. The method of claim 15, further comprising coupling a slave pulse generator to the second delay element, the slave pulse generator having the first delay element for shaping a slave pulse of the slave clock signal.

20. The device of claim 15, further comprising coupling the master clock signal and the slave clock signal to a slave pulse detector, the slave pulse detector delaying the generation of an edge of the master clock signal relative to the slave clock signal.

* * * * *